United States Patent
Sharma et al.

(10) Patent No.: US 8,448,032 B2
(45) Date of Patent: May 21, 2013

(54) PERFORMANCE OF SIGNATURE-BASED DIAGNOSIS FOR LOGIC BIST

(75) Inventors: Manish Sharma, Wilsonville, OR (US); Wu-Tung Cheng, Lake Oswego, OR (US); Thomas H. Rinderknecht, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 236 days.

(21) Appl. No.: 12/918,988

(22) PCT Filed: Feb. 23, 2009

(86) PCT No.: PCT/US2009/034933
§ 371 (c)(1),
(2), (4) Date: Apr. 1, 2011

(87) PCT Pub. No.: WO2009/105788
PCT Pub. Date: Aug. 27, 2009

(65) Prior Publication Data
US 2011/0179326 A1    Jul. 21, 2011

Related U.S. Application Data

(60) Provisional application No. 61/030,574, filed on Feb. 22, 2008.

(51) Int. Cl.
*G01R 13/28* (2006.01)

(52) U.S. Cl.
USPC .......................... 714/732; 714/737; 714/742

(58) Field of Classification Search
USPC .......................... 714/732, 737, 742; 702/185
See application file for complete search history.

(56) References Cited

U.S. PATENT DOCUMENTS

| | | | |
|---|---|---|---|
| 6,442,723 B1 * | 8/2002 | Koprowski et al. | 714/732 |
| 2006/0200719 A1 * | 9/2006 | Keller | 714/732 |

* cited by examiner

*Primary Examiner* — Sam Rizk

(57) ABSTRACT

Techniques are disclosed for reducing the set of initial candidates in signature based diagnosis methodology. These techniques are based on a unique way of making optimum use of information from logic back-cone tracing along with equations that describe the test response compactor.

20 Claims, 4 Drawing Sheets

Hypothetical design to illustrate the working of logic back cone tracing in Step-A.1. This example assumes the observed failing behavior is failures on scan cells $s_{14}$ and $s_{15}$.

Hypothetical design to illustrate the working of logic back cone tracing in Step-A.1.1 and Step-A.1.2. This example assumes the observed failing behavior is failures on cycles $c_1$ and $c_2$.

Hypothetical design to illustrate the working of Step-A.
This example assumes the observed failing behavior is
failures on scan cells $s_{14}$ and $s_{15}$.

Hypothetical design to illustrate the working of logic back cone
tracing in Step-A.1. This example assumes the observed
failing behavior is failures on scan cells $s_{14}$ and $s_{15}$.

Hypothetical design to illustrate the working of logic back cone tracing in Step-A.1.1 and Step-A.1.2. This example assumes the observed failing behavior is failures on cycles $c_1$ and $c_2$.

(a) Logic Back Cone Tracing for Failing MISR Bit $b_2$ (b) Logic Back Cone Tracing for Failing MISR Bit $b_2$ with Inconsistent Set = {$s_B$}

PERFORMANCE OF SIGNATURE-BASED DIAGNOSIS FOR LOGIC BIST

RELATED APPLICATIONS

This application claims priority to U.S. Provisional Patent Application No. 61/030,574, entitled "Improving The Performance Of Signature Based Diagnosis For Logic Bist," filed on Feb. 22, 2008, and naming Manish Sharma, Wu-Tung Cheng, and Thomas H. Rinderknecht as inventors, which application is incorporated entirely herein by reference.

FIELD OF THE INVENTION

The present invention is directed to performing fault diagnostics or enhancing fault diagnostics of integrated circuits.

BACKGROUND OF THE INVENTION

The Logic Built-In Self Test (LBIST) test methodology is being increasingly adopted as a complement to scan based structural testing. In Logic BIST, additional hardware is added to the chip to be tested. This additional hardware comprises a random pattern generator (typically a Linear Feedback Shift Register or LFSR) and a test response analyzer (typically a Multiple Input Signature Register or MISR). During Logic BIST, pseudo random patterns are applied to the chip under test (CUT) through the scan chains using the on chip pattern generator and the response of the CUT to these patterns is compacted into a test signature in the on chip test response analyzer. Since Logic BIST only applies pseudo random patterns, it cannot achieve the same fault coverage as a scan based structural test set generated using an Automatic Test Pattern Generation (ATPG) tool. However, since Logic BIST only applies pseudo random patterns, it has a significant advantage over scan based structural test: it needs very minimal support from the external test environment (incidentally, this is why the technique is named Built in Self Test). Ordinarily, the only interaction with the outside test environment is at the beginning of testing when an initial seed for the pseudo random pattern generator along with a start signal is provided, and at the end of testing when the test signature in the test response analyzer is compared with a golden value. For this reason, Logic BIST can be used to apply millions of test patterns to the CUT with the aim of catching obscure, unexpected and hard to model issues. These can include un-modelled timing marginalities, crosstalk, power defects that have unstable behaviour, etc. With increasing design complexities and a fabrication process that is flirting with the limits imposed by the laws of physics, accounting for such issues during design time is becoming extremely difficult. To handle such unexpected issues during testing, Logic BIST has been increasingly adopted as a preferred test technique.

Due to the above trend, it has become more important to devise effective diagnosis methodologies for Logic BIST. The main challenge with such a methodology is that since the test response is compacted into the test response analyzer, the actual failing scan cells are not known, which is what conventional diagnosis algorithms use to determine the most likely location within the circuit from which the failure originated. Several solutions to this problem have been proposed. However, all of these conventional solutions place unreasonable requirements on Logic BIST design, like significant additional hardware, multiple test applications, etc.

In current practice, the diagnosis of chips that fail LBIST tests is performed using the following procedure:

a. The Logic BIST test patterns that failed are identified by comparing the test signature at the end of every pattern to the expected signature at that point and thereafter resetting the test response analyzer to the correct expected value to make the failing patterns independent;
b. Special bypass patterns are generated corresponding to each of the Logic BIST failing tests identified above; and
c. The chip is retested with these bypass patterns with the chip in a special bypass mode in which the scan chains are accessed directly at the chip pins without having to go through the test response analyzer or random pattern generator. This way the actual failing scan cells for each failing pattern are identified. Hereafter, conventional logic diagnosis can be used.

The above diagnostic method is very cumbersome since it requires separate bypass test patterns to be generated and applied. Moreover, in many cases, it may be impossible to get bypass patterns that are exactly the same as the failing Logic BIST tests, in which case there may be a situation in which a Logic BIST pattern fails but the corresponding bypass pattern does not fail.

Recently, a new technique called "signature based diagnosis for Logic BIST" has been introduced that does not require patterns to be re-applied in bypass mode and can perform diagnosis from only the failing test signature itself, thus significantly reducing the complexity of LBIST diagnosis. Signature based diagnosis methodologies provide attractive methods for diagnosing Logic BIST failures because they eliminate most of the complexity associated with the traditional approach to logic BIST diagnostics while achieving similar diagnosis resolution. Embodiments of the signature based diagnosis methodology are described, for example, in W.-T. Cheng, M. Sharma, T. Rinderknecht, L. Lai and C. Hill, "Signature Based Diagnosis for Logic BIST" in *Proc. Intl. Test Conf.*, 2006, and United States Published Patent Application No. 2007/0100586, filed Oct. 20, 2006, and entitled "Direct Fault Diagnostics Using Per-Pattern Compactor Signatures," both of which are incorporated herein by reference. One issue that can be encountered during application of the technique is that since only the failing test signature is known, a large number of potentially failing locations may need to be simulated before finding the ones that best explain the failing behaviour. This will directly translate into undesirably long processing time for logic diagnosis.

BRIEF SUMMARY OF THE INVENTION

With various examples of the invention, techniques for reducing this set of initial candidates are provided. For example, some implementations of the invention may realize this reduction by utilizing the relationship between failing scan cells and the errors these failures cause in the test signature. Various embodiments of the invention may provide techniques that use information from logic back-cone tracing along with equations that describe the test response compactor. Experimental data is also presented that shows that a significant reduction in the initial candidate set size is achievable using embodiments of the disclosed techniques while incurring only a small overhead.

Representative embodiments of methods, apparatus, and systems for performing fault diagnostics or enhancing fault diagnostics are disclosed herein that should not be construed as limiting in any way. Instead, the present disclosure is directed toward all novel and nonobvious features and aspects of the various disclosed methods, apparatus, and systems, and their equivalents, alone and in various combinations and sub-combinations with one another. The disclosed technology is not limited to any specific aspect or feature, or combination thereof, nor do the disclosed methods, apparatus, and systems require that any one or more specific advantages be present or problems be solved. Moreover, any of the methods, apparatus, and systems described herein can be used in connection with a wide variety of scan-based or partially-scan-based circuits that utilize signature-based test hardware.

Any of the methods, apparatus, and systems described herein can be used in conjunction with the manufacture and testing of a wide variety of integrated circuits (e.g., application-specific integrated circuits (ASICs), programmable logic devices (PLDs) such as a field-programmable gate arrays (FPGAs), or systems-on-a-chip (SoCs)), which utilize a wide variety of components (e.g., digital, analog, or mixed-signal components). The one or more integrated circuits being manufactured and tested can be used in a vast assortment of electronic devices, ranging from portable electronics (such as cell phones, media players, and the like) to larger-scale items (such as computers, control systems, airplanes, automobiles, and the like). All such items comprising integrated circuits analyzed using embodiments of the disclosed technology or equivalents are considered to be within the scope of this disclosure.

Although the operations of some of the disclosed methods are described in a particular, sequential order for convenient presentation, it should be understood that this manner of description encompasses rearrangement, unless a particular ordering is required by specific language set forth below. For example, operations described sequentially can be rearranged or performed concurrently. Moreover, for the sake of simplicity, the figures herein may not show the various ways in which the disclosed methods, apparatus, and systems can be used in conjunction with other methods, apparatus, and systems. Additionally, the description sometimes uses terms like "determine" and "identify" to describe the disclosed technology. These terms are high-level abstractions of the actual operations that are performed. The actual operations that correspond to these terms may vary depending on the particular implementation and are readily discernible by one of ordinary skill in the art.

The disclosed embodiments can be implemented in a wide variety of environments. For example, the disclosed analysis techniques can be implemented at least in part as software comprising computer-executable instructions stored on one or more computer-readable media (for example, one or more CDs, volatile memory components (such as DRAM or SRAM), or nonvolatile memory components (such as hard drives)). Such software may comprise, for example, electronic design automation (EDA) software used to diagnose test responses captured and compressed into signatures during production testing of one or more integrated circuits (for example, application specific integrated circuits (ASICs), programmable logic devices (PLDs) such as field-programmable gate arrays (FPGAs), or a systems-on-a-chip (SoCs), any of which can have digital, analog, or mixed-signal components thereon). This particular software implementation should not be construed as limiting in any way, however, as the principles disclosed herein are generally applicable to other software tools. Circuit faults that are detected in part using the disclosed techniques may in some circumstances be repaired.

The one or more integrated circuits being tested additionally comprise hardware components used to implement the testing (e.g., BIST hardware for generating test patterns and signatures). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits tested using embodiments of the disclosed technology or equivalents are considered to be within the scope of this disclosure.

Any such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer, but can be implemented using any suitable commercially available computer and/or language. For the same reason, computer hardware for executing the software implementations is not described in further detail. Any of the disclosed methods can alternatively be implemented (partially or completely) in hardware (for example, an ASIC, PLD, or SoC).

Intermediate or final diagnostic results produced from any of the disclosed methods can be created, updated, or stored on one or more computer-readable media, volatile memory components, or nonvolatile memory components using a variety of different data structures or formats. For example, initial candidate sets, or compactor equations or super variables used to determine such sets, that are produced using embodiments of the disclosed technology may be stored on one or more computer readable-media. Such diagnostic results can be created or updated at a local computer or over a network (for example, by a server computer).

DETAILED DESCRIPTION OF THE INVENTION

Exemplary Operating Environment

Figure 1:
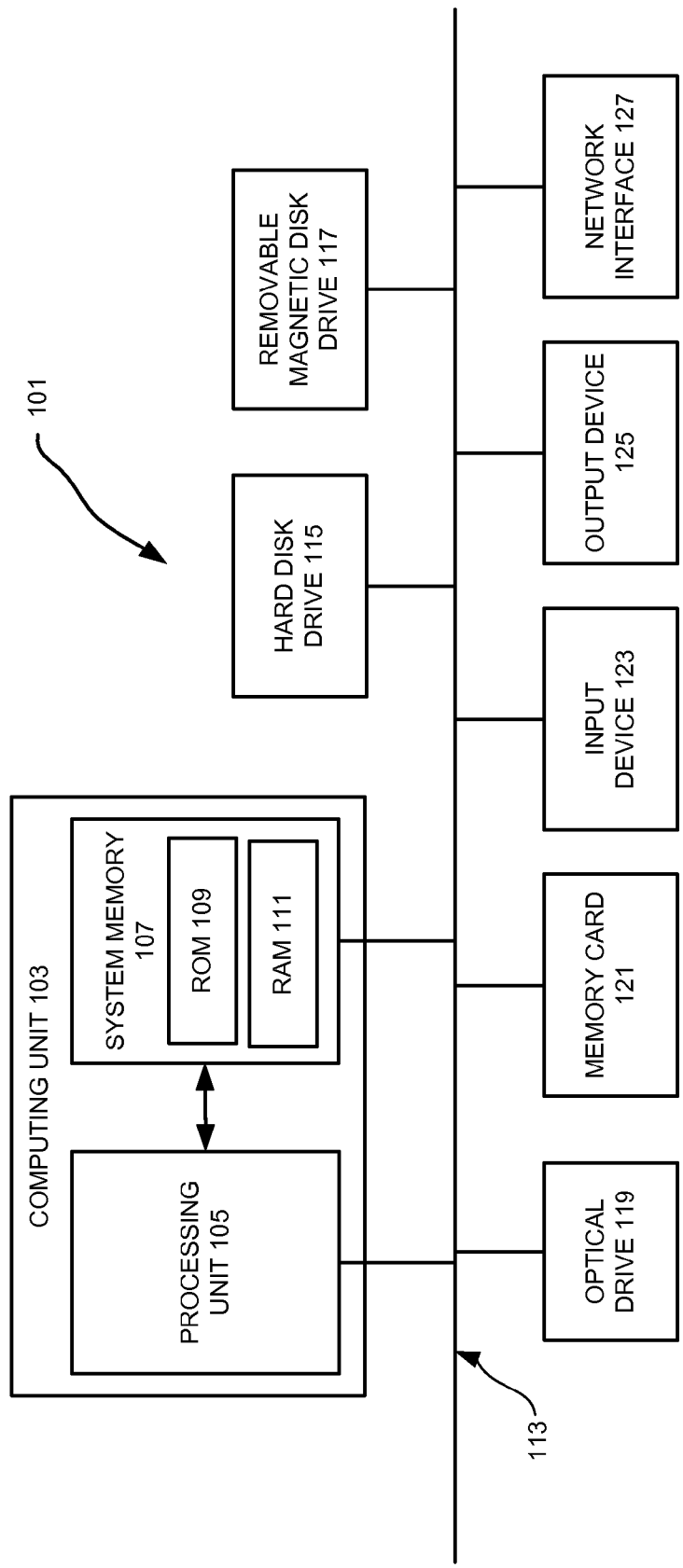
FIG. 1 shows an illustrative example of a computing device that may be employed with various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Overview of Logic Diagnosis and Direct Diagnosis

This section provides further background to the disclosed technology and introduces exemplary terminology that is used in the rest of the disclosure. The section begins with a high level overview of the logic diagnosis process. Next an overview of a technique called direct diagnosis is provided. This technique forms the underlying basis of signature based diagnosis, which is described next. Having provided this background, the problem that is addressed by embodiments of the disclosed technology is formally defined.

When a chip being tested fails a scan based test, it is desirable to know the root cause of this failure. Logic diagnosis is the process which takes in the observed failing behavior of a defective chip and determines the most likely defect location(s) and defect types that best explain the failing behavior. At the logic level, a location can be defined to be a library cell pin and the interconnect net associated with that pin.

Logic Back-Cone Tracing

Figure 2:
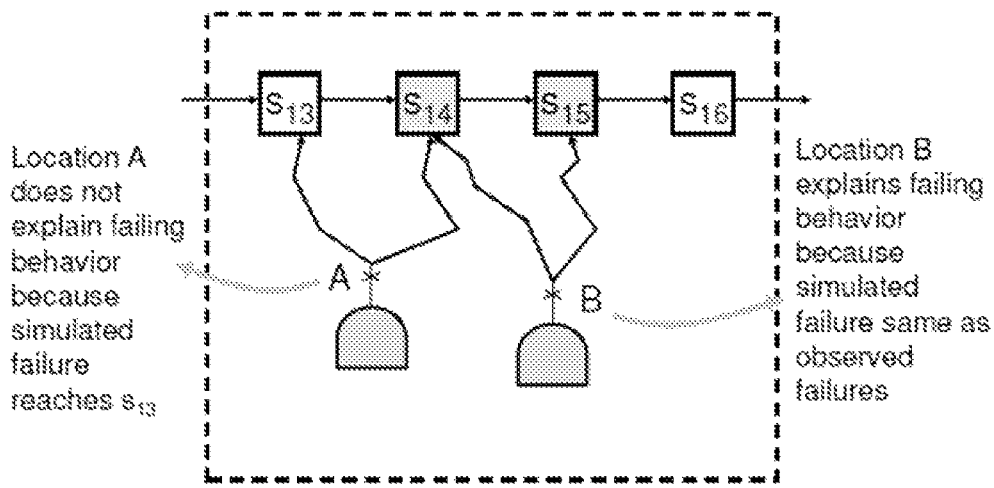
FIG. 2 illustrates an exemplary diagnosis procedure.

To begin with, consider scan based structural testing of a simple design, where the scan chains are directly accessed at the chip pins. In this case the observed failing behavior of a defective chip constitutes the set of failing scan cells for each test pattern that fail for the chip. At a high level, a typical logic diagnosis process that uses this failing behavior to determine the most likely defect(s) comprises two main method acts, which are set forth below. Logic diagnosis techniques are typically based on the Single Location at a Time (SLAT) paradigm, which basically states that no matter how complex a defect is, it is most likely to cause a single location to fail for a specific failing test pattern. Most logic diagnosis tools use the SLAT paradigm in one form or another because this allows the tool to analyze the locations in the design independent of each other. The SLAT paradigm is assumed to apply throughout this disclosure.

a. Method Act-A: For each failing pattern, simulate all locations in the design and choose those as the candidate defect locations for which the simulated failing behaviour explains the observed failing behaviour of the defective chip. This means that the scan cells predicted to fail by simulating the location are the same as those in the observed failing behaviour of the test pattern (see, e.g., FIG. 2).

b. Method Act-B: Analyze the most likely defect locations determined in Step-A above to determine the most probable defect type (e.g., a bridge between nets, an open via or net segment, a defect inside a library cell, etc.). It should be noted that the simulation in Method Act-A is ordinarily a single stuck-at fault simulation. In the above procedure, the most time consuming portion is this simulation. In order to make this process more efficient, method act-A can be split up as follows:

i. Method Act-A.1: Use a simplified and efficient method that filters out those locations that can never explain an observed failing behaviour for a specific failing pattern. This can be performed, for example, using a variant of the star algorithm in which logical back-tracing is performed starting from the failing scan cells in the observed failing behaviour. See, e.g., S. B. Akers, B. Krishnamurthy, S. Park and A. Swaminathan, "Why is less information from logic simulation more useful in fault simulation" in *Proc. Intl. Test Conf.*, 1990, pp. 786-800, which is incorporated herein by reference. This way a large number of locations, which when failing produce failures that can never reach at least one of the failing scan cells in the observed failing behaviour, can be filtered out. This process will be referred to hereinafter as logic back-cone tracing. The locations that remain after logic back cone tracing form the set of initial candidates, which are then processed in the next method act. Typically the initial candidate set is a very small subset of all the locations in the design.

ii. Method Act-A.2: This act is the same as the original method act-A, except now the simulation needs to be performed only for the locations in the initial candidate set as determined in the method act-A.1.

As mentioned before, logic back-cone tracing starts at a failing scan cell and back traverses through the design starting from the failing scan cell to mark all those locations that lie in its logical back cone. Stated generally, logic back-cone tracing starting at a scan cell identifies all those locations such that, a failure originating at these locations can potentially reach the scan cell. Note that, as mentioned before, this is a simplified and efficient method. Whether a failure originating at a location reaches the scan cell in question can only be precisely answered by performing full fault simulation.

If a location is identified by logic back-cone tracing from a scan cell, it is said to lie in the logic back-cone of the scan cell. To summarize, a failure originating at a location may reach a particular scan cell only if it lies in the logic back-cone of that scan cell. This understanding of logic back cone tracing is useful to the description of the exemplary embodiments described below.

Figure 3:
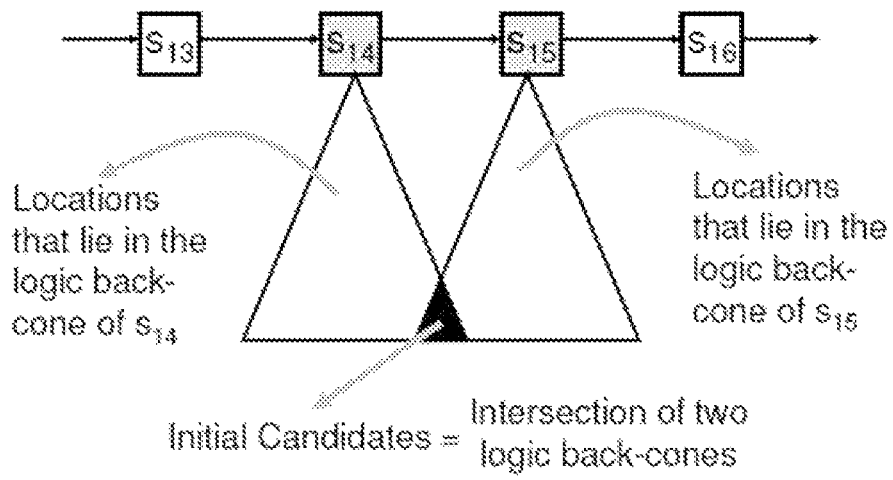
FIG. 3 illustrates logic back-cone tracing to determine initial candidates that may be employed according to various embodiments of the invention.

Returning to logic diagnosis and method act-A.1, logic back-cone tracing can be used as follows: for the failing test pattern currently being processed, determine the set of locations that lie in the logic back-cone of each failing scan cell in its observed failing behaviour. Since the defect is assumed to affect only a single location in a given pattern (SLAT), an intersection of the sets of locations corresponding to each scan cell is then taken to form the set of initial candidates (see, e.g., FIG. 3).

Direct Diagnosis

Figure 4:
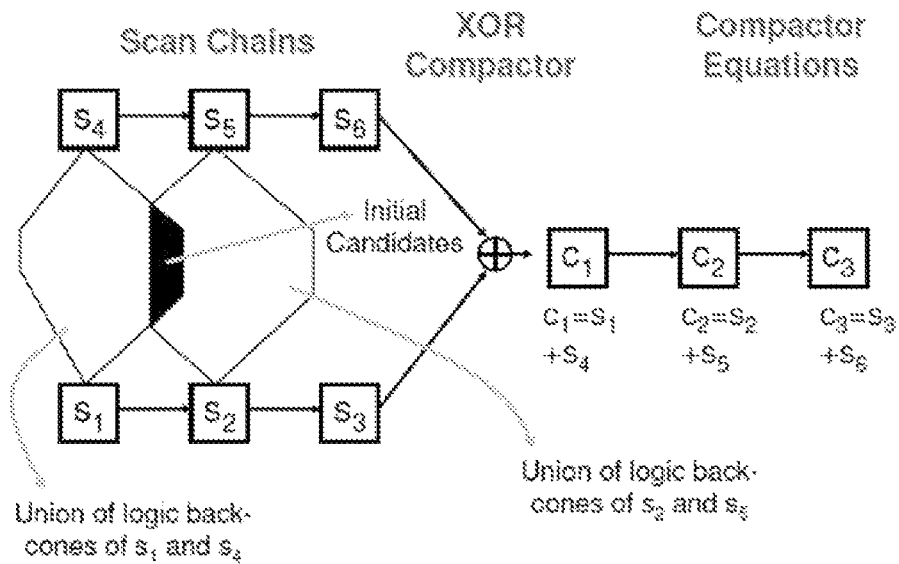
FIG. 4 illustrates logic back-cone tracing for designs with a test response compactor that may be employed according to various embodiments of the invention.

The discussion of the logic diagnosis process has so far been limited to simple designs where scan chains can be accessed directly from chip pins. However, larger design sizes often use test compression. From the point of view of diagnosis, this means that a test response gets compacted using on chip hardware before becoming accessible at chip pins. In order to handle this situation, embodiments of the direct diagnosis technique disclosed in W.-T. Cheng, K.-H. Tsai, Y. Huang, N. Tamarapalli and J. Rajski "Compactor Independent Direct Diagnosis," *Proc. Asian Test Symposium*, pp. 204-209, 2004; A. Leininger, P. Muhmenthaler, W.-T. Cheng, N. Tamarapalli, W. Yang, K.-H. Tsai, "Compression-Mode Diagnosis Enables High-Volume Monitoring Diagnosis Flow," *Proc. International Test Conference,* 2005, paper 7.3; and U.S. Pat. No. 7,239,978, all of which are hereby incorporated herein by reference, can be used. In general, embodiments of the direct diagnosis procedure involve a diagnosis process similar to using method act-A and method act-B. However, the act of determining the set of initial candidates in method act-A.1 is different. As an example, consider a design with two scan chains whose outputs are compacted using a 2-input XOR gate before coming out at a chip pin (see, e.g., FIG. 4). Hence, in this case, the observed failing behavior comprises the scan shift cycles at which the compactor output fails for each failing test pattern. As a result, logic back-cone tracing cannot be performed as described earlier since the failing scan cells are not known. To overcome this, and in certain direct diagnosis embodiments, compactor equations are used. These equations, for example, relate the failures in the compacted test response that can be accessed at chip pins to failures in the internal scan cells. For our example, the compacted test response is the XOR gate output at different scan shift cycles. Hence the compactor equations simply become the exclusive-OR of the scan cells in the two chains that get combined in each shift cycle as shown in FIG. 4. These compactor equations can be used in method act-A.1 as follows:

a. Method Act-A.1.1: For a failing shift cycle in the failing pattern being processed, determine the scan cells from the corresponding compactor equation. Perform logic back-cone tracing from each of these scan cells and take a union of the sets of locations thus determined. The set of locations resulting from this union are all those locations that can potentially explain the failing compactor output at the current shift cycle.

b. Method Act-A.1.2: Repeat method act A.1.1 for one or more additional failing shift cycles (e.g., all failing shift cycles) in the current failing pattern and in the end, as before, compute an intersection of all the location sets from each failing cycle to form the initial candidate set (see, e.g., FIG. 4).

This initial candidate set is then simulated as in Method Act-A.2 to determine those locations that explain the failing behaviour. The only difference here is that the compactor operation is desirably accounted for during simulation.

Embodiments of the direct diagnosis methodology are not limited to the simple XOR gate compactor. In fact, embodiments of the technology can be used with any test response compactor as long as the corresponding compactor equations can be determined. In particular, direct diagnosis can be used with a MISR, which is the compactor of choice in Logic BIST as discussed in the next sub-section.

Signature Based Diagnosis For Logic BIST

In order to perform diagnosis of Logic BIST fails, the failing patterns are desirably identified and decoupled from each other. Without such identification and decoupling, the SLAT paradigm cannot be used, and it would be extremely hard to diagnose any reasonable defect type besides those that behave exactly as stuck-at faults. As described above, failing patterns can be identified by checking the MISR signature at the end of each pattern and resetting it thereafter. This not only decouples and identifies the individual failing patterns in a Logic BIST run but also determines the failing bits in the MISR signature for each failing pattern. Signature based diagnosis is an extension of direct diagnosis that performs logic diagnosis using only the above observed failing behaviour, i.e. the failing bits in the MISR signature for each failing pattern.

In the case of signature based diagnosis, the compactor equations discussed in the previous sub-section relate each bit in the MISR to the internal scan cells. The details of how to compute these equations can be found in W.-T. Cheng, M. Sharma, T. Rinderknecht, L. Lai and C. Hill, "Signature Based Diagnosis for Logic BIST" in *Proc. Intl. Test Conf.,* 2006, and United States Published Patent Application No. 2007/0100586, entitled "Direct Fault Diagnostics Using Per-Pattern Compactor Signatures," and need not be recited here. Once the compactor equations are determined, the direct diagnosis methodology as described in the previous sub-section can be followed. To illustrate this, consider the example Logic BIST setup shown in FIG. 5.

Figure 5:
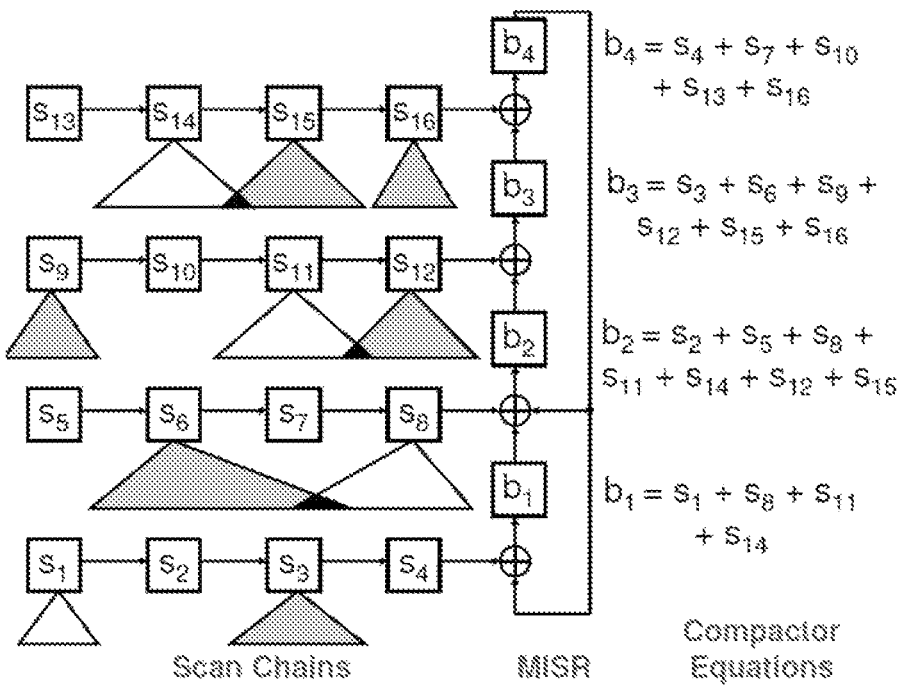
FIG. 5 illustrates a logic BIST design example that may be employed according to various embodiments of the invention.
Figure 6:
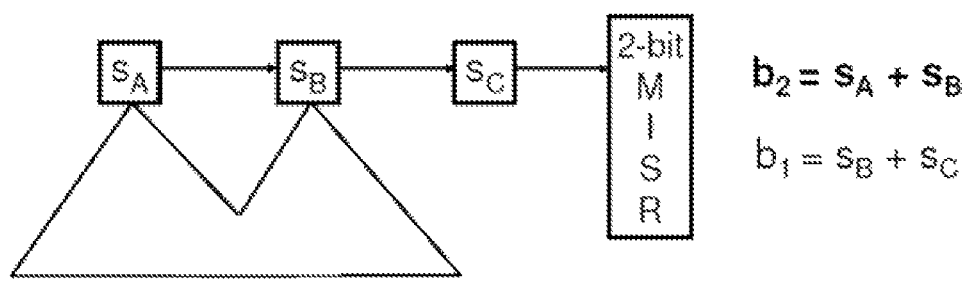
FIG. 6 illustrates an example of an EQN-trace technique that may be employed according to various examples of the invention.
Figure 6:
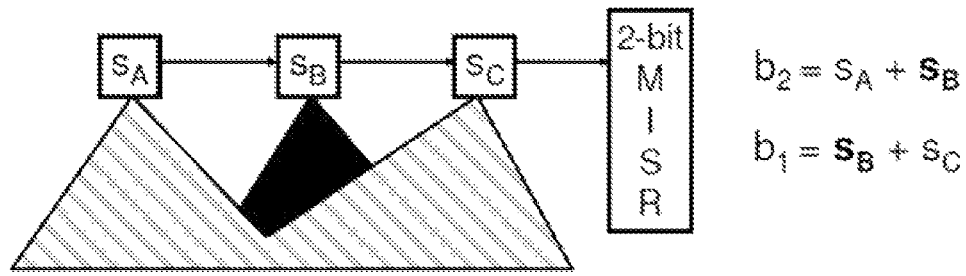

This example design has four scan chains feeding into a four bit MISR. FIG. 5 also shows the compactor equations. Consider a failing pattern whose MISR signature has bits $b_1$ and $b_3$ failing. In this case, method act-A.1 of signature based diagnosis proceeds as follows. The logic back-cone tracing is performed for scan cells in the compactor equation for $b_1$, i.e. $s_1, s_8, s_{11}$, and $s_{14}$. A union of these sets of locations is then performed (conceptually illustrated by the clear triangles in FIG. 5). The same process is repeated for scan cells $s_3, s_6, s_9, s_{12}, s_{15}$ and $s_{16}$ in the compactor equation for $b_3$ (conceptually illustrated by the shaded triangles in FIG. 5) to get all those locations that can potentially explain a failure on bit $b_3$. Finally an intersection between the above two sets (conceptually illustrated by the dark triangles in FIG. 5) forms the set of initial candidates.

Problem Definition

Signature based diagnosis allows for a simple diagnosis flow with no additional hardware requirements, making it an attractive technique for performing diagnosis of Logic BIST fails. However, for very large designs, one potential limitation can be long run diagnosis run times. Since signature based diagnosis typically performs logic back-cone tracing starting from all the scan cells in the failing MISR bit's compactor equation, the size of the initial candidate set may be too large.

To address this potential problem, exemplary techniques are described herein that make use of the information obtained from logic back-cone tracing along with the compactor equations to reduce the size of the initial candidate set.

The initial candidate selection process of the signature based diagnosis technique as described in the previous section does not take full advantage of the information obtained from logic back-cone tracing combined with the compactor equations. To review, if a location lies in the logic back-cone of a scan cell, then a failure originating at it may potentially reach the scan cell. However, in the case that a location does not lie in the logic back-cone of a scan cell, then a failure originating from this location can never reach the scan cell. It is this latter negative aspect of the information obtained from logic back-cone tracing that provides a powerful method for reducing the set of initial candidates. Referring back to the example in FIG. 5, where the observed failing behavior of a pattern comprised of failing MISR bits b1 and b3, it should be considered that a location L lies only in the logic back-cone of scan cells s6 and s8. This means that these are the only two scan cells that a failure originating at L can reach. Viewing this information along with the compactor equations from FIG. 5, and knowing that only s6 and s8 can fail, the compactor equations can be reduced to the following set of equations:

$$b_4=0$$

$$b_3=s_6$$

$$b_2=s_8$$

$$b_1=s_8$$

It is obvious that there is an inconsistency in the above set of equations because in order for L to explain the failure at bit b1, the failure originating at L must reach s8. However, this would mean that the MISR bit b2 must also fail, which is not the case. Therefore, using only the information obtainable through logic back-cone tracing, one of ordinary skill in the art can conclude that L can never explain the observed failing behavior whereas the process described in the previous section cannot reach this conclusion (L will be included in the initial candidate set determined using the process described in the previous section because s6 is part of the compactor equation of failing bit b3 and s8 is part of the compactor equation of failing bit b1).

The concept behind the example above can be more generally described as follows. Assume a location L lies in the logic back-cone of a set of scan cells denoted by S. Then consider the reduced compactor equations in which all the scan cell terms not in S have been removed from the right hand side of the equations (or other corresponding side of the equations). Furthermore, on the left hand side of the equations (or other corresponding side of these equations), replace a failing MISR bit in the observed failing behavior with a constant 1 and the non-failing MISR bits with a constant 0. Treating this set of reduced equations as a set of binary linear equations in n=|S| variables, use any known technique (e.g., Gaussian elimination) to determine if there exists a solution to these equations. The location L can potentially explain the observed failing behavior if and only if there exists a solution to the above equation set. Hence, this method achieves maximum use of the information in the compactor equations and logic back-cone tracing.

Having established a way to reduce the number of initial candidates, a procedure is now presented that is capable of determining the minimum sized initial candidate set achievable using only the information in logic back-cone tracing and the compactor equations for a given specific case. This section presents an embodiment of such a procedure that is termed the MinSet procedure. As will be seen below, MinSet may be computationally intensive, but the procedure is not intended for use with the overall diagnosis process. Instead, the procedure just provides a method to determine a lower bound on the initial candidate set size. An exemplary embodiment of the MinSet procedure works as follows:

a. Given the failing bits in the MISR signature of some failing pattern, the goal is to determine the minimum possible initial candidate set.
b. Perform an independent logic back-cone trace starting from each scan cell in the design. This will establish a mapping from a scan cell to all the locations that lie in its logic back-cone.
c. Invert the mapping obtained in the previous step to establish a mapping from a location in the design to all the scan cells in whose logic back-cone it lays.
d. For each location in the design, use the above mapping and the compactor equations to determine a reduced set of equations as described in the previous section. Add the location to the initial candidate set only if there exists a solution to this set of equations.

In certain implementations, the most computationally intensive part of the above procedure is where logic back-cone tracing is performed independently from all the scan cells in the design. However, using embodiments of the disclosed technology, logic back-cone tracing can be started from groups of scan cells, rather than from individual scan cells. In order to illustrate such embodiments, reference is made to the example in FIG. 4. For convenience the compactor equations for this example design are repeated below:

$$b_4=s_4+s_7+s_{10}+s_{13}+s_{16}$$

$$b_3=s_6+s_9+s_{12}+s_{15}+s_{16}$$

$$b_2=s_2+s_5+s_8+s_{11}+s_{14}+s_{12}+s_{15}$$

$$b_1=s_1+s_8+s_{11}+s_{14}$$

In this set of equations, it can be see that certain groups of scan cells always occur together in any equation. For example $s_{12}$ and $s_{15}$ occur together in the equations for MISR bits $b_3$ and $b_2$. This means that a new variable, $s_{12,15}=s_{12}+s_{15}$, can be defined, and replace the expression $s_{12}+s_{15}$ everywhere in the above set of equations with this new variable. Such a variable, which is the sum of a group of scan cells that always occur together in the compactor equations, will be referred to as a super variable. One can observe that other super variables that can be formed for the above set of equations are:

$$s_{12,15}=s_{12}+s_{15}$$

$$s_{2,5}=s_2+s_5$$

$$s_{8,11,14}=s_8+s_{11}+s_{14}$$

$$s_{3,6,9}=s_3+s_6+s_9$$

$$s_{4,2,10,13}=s_4+s_7+s_{10}+s_{13}$$

It can be seen that the substitution with super variables will not change the structure of the equations; however, it will have an impact on the MinSet procedure. Instead of having to perform logic back-cone tracing from each individual scan cell independently, this operation can be performed starting from the scan cells that are part of a super variable as one group. In other words the number of independent logic back-cone tracing operations that need to be performed can be reduced from the total number of scan cells in the design to the total number of super variables that can be identified from the compactor equations (in our example, it will go down from 16 to 7). As will been seen from the experimental results presented below, this represents a significant reduction, and it makes implementing and executing MinSet manageable. However, the procedure of determining the minimum possible initial candidate sets still remains computationally expensive and is not desirably used as part of the overall diagnostic process. In the next section, exemplary methods for efficiently reducing the initial candidate size are introduced that combine information from logic back-cone tracing with compactor equations.

An exemplary embodiment of a method for reducing the initial candidate set (also referred to as the EQN-Trace technique) starts with the initial candidate set determined by signature based diagnosis (e.g., method act-A.1.1 and method act-A.1.2 described above). From this set, the exemplary embodiment filters out locations that can never explain the observed failing behaviour using the same methodology discussed in the previous two sections. The goal is to filter out as many such locations as possible while keeping the procedure efficient.

To aid the discussion in this section, the following terminology is defined: a set of scan cells S is said to be inconsistent if the set of reduced compactor equations for S has no solution. A location L is said to lie in the exclusive logic back-cone of a set of scan cells S if and only if all those scan cells whose logic back-cones include L are in S. The exemplary MinSet procedure presented in the previous section determines the set of all the scan cells (or super variables) in whose logic back-cone a location lies, and then checks if this set of scan cells is inconsistent. In exemplary embodiments of the EQN-Trace technique, this process can be turned the other way around to start with an inconsistent set of scan cells, say $S_{incons}$, and then determine all those locations that lie in the exclusive logic back-cones of $S_{incons}$. Since a failure originating from such locations can only reach the scan cells in the inconsistent set $S_{incons}$, they cannot explain the observed failing behavior and can be removed from the initial candidate set. By using more and more inconsistent scan cell sets, more and more locations can be removed from the initial candidate sets. Two concerns are desirably addressed with such an approach: First, how can "good" inconsistent scan cell sets be determined that achieve a desirable reduction in the set of initial candidates? Second, how can the locations that lie in the exclusive logic back-cone of an inconsistent scan cell set be determined? These two questions are addressed in the remaining part of this section, starting with the second question.

At first glance, it seems like determining if a location lies in the exclusive logic back-cone of a set of scan cells is equivalent to determining all the scan cells in whose logic back-cones the location lies. This would appear to be similar to the exemplary MinSet procedure in the previous section. However, it should be noted that enumerating the above locations is not of concern; instead, it is desirable to just remove them from the initial candidate set as determined by the signature based diagnosis technique. The following example illustrates one exemplary technique for removing such locations: Consider a hypothetical Logic BIST design with only three scan cells $s_A$, $s_B$ and $s_C$ and a two bit MISR with compactor equations as shown in FIG. 5. Now consider a failing pattern for which only MISR bit $b_2$ fails. In this situation, signature based diagnosis will determine the initial candidate set as the union of logic back-cones of $s_A$ and $s_B$ (conceptually illustrated by the clear region shown in FIG. 5(a)). Now, it can be observed that for this failure scenario, the scan cell set $S=\{s_B\}$ is inconsistent, and the locations in exclusive logic back-cone of S should be determined. This can be done by performing logic back-cone tracing from the set of remaining scan cells, i.e. $S_C=\{s_A, S_C\}$ (conceptually illustrated by the shaded region in FIG. 5(b)) and then taking an intersection with the existing initial candidate set. Since the logic-back cone tracing from $S_C$ will not include any locations that are exclusively in the logic back-cone of S (conceptually illustrated by the dark region in FIG. 5(b)), all such locations can be removed from the initial candidate set after the set intersection. Therefore, in general, for removing all locations that are exclusive to an inconsistent set S, one can determine a union of the logic back-cones of scan cells not in S and intersect this with the current initial candidate set. Note that these two operations (union followed by intersection) are the same as in method act-A.1.1 and method act-A.1.2 described above and therefore can be efficiently merged into the initial candidate set determination process. In fact, it is just as if additional pseudo failing MISR bits were being created from the observed failing behaviour and letting signature based diagnosis run its course, albeit with a smaller initial candidate set.

Having determined how inconsistent scan cell sets can be efficiently used to reduce initial candidate set size, this section describes embodiments for determining "good" inconsistent sets that achieve a desirable reduction of the initial candidates. In certain embodiments of the disclosed technology, a heuristic is used that is based on the following two observations. The first observation is that the larger an inconsistent scan cell set is, the more locations are likely to lie in its exclusive logic back-cone and, hence, the bigger the reduction its use will bring about in the initial candidate set. The second observation is that it is better to include contiguous scan cells (i.e., scan cells that are adjacent to each other on a scan chain) in the inconsistent set. This is because scan cells that are close to each other in a scan chain are also likely to be "close" in a logical sense, meaning that more locations will lie in their exclusive logic back-cones. For example all the sequential elements in a functional block are likely to be adjacent to each other on a scan chain and all the locations within that block are likely to lie in their exclusive logic back-cone. Based on these two observations, embodiments of the EQN-Trace technique use the following heuristic procedure to determine "good" inconsistent sets: Start with an empty inconsistent set and continue adding contiguous scan cells to this set until it remains inconsistent. When no more contiguous scan cells can be added, jump to the next closest scan cell to the last added scan cell and repeat until all scan cells have been tried. This ensures creation of large inconsistent sets containing several contiguous sections of scan chains.

Therefore, to summarize, embodiments of the EQN-Trace procedure add one additional method act prior to method act-A.1.1 in the initial candidate determination process of signature based diagnosis as described above. This additional method act can be described as follows:

Method act-A.1.0: Using the heuristic above, determine k inconsistent sets, $S_1, S_2 \ldots S_k$, based on the observed failing behaviour of the current failing pattern. From these sets, create k pseudo failing MISR bits where the compactor equation of the $i^{th}$ pseudo failing bit contains all the scan cells not in $S_i$. Add these pseudo failing bits to the real failing MISR bits from observed failing behaviour and proceed to method act-A.1.1.

The addition of the pseudo failing bits will typically reduce the initial candidate set size. Finally, it should be noted that super variables as described above can be used in all the operations of the exemplary embodiments of the EQN-Trace procedure, further improving the overall efficiency.

Experimental Results

In order to evaluate the exemplary techniques disclosed in this paper, experiments were performed on a large industrial Logic BIST design. The characteristics of this design are given in Table 1 below:

TABLE 1

Industrial Designs Used for Experiments

| Total Number of Scan Chains | Total Number of Scan Cells | MISR Size | Number of Gates in the Logic Model | Compaction Ratio Per Pattern |
|---|---|---|---|---|
| 322 | 157K | 33 | 14M | 4757X |

First the compactor equations, and the super variables contained in these equations, were determined for the design. Results from these are given in Table 2 below:

TABLE 2

Compactor Equations and Super Variables

| Average Scan Cells per Compactor Equation | Number of Super Variables | Average Scan Cells per Super Variable |
|---|---|---|
| 69K | 1023 | 151 |

The main observation to be made from this table is that the use of super variables represents a major performance improvement for both the exemplary MinSet and EQN-Trace procedures. In particular, since the average number of scan cells per super variables is ~151, using super variables produces around a 150× performance improvement in all the operations involved in MinSet and EQN-Trace.

For the above design, 9 different failing behaviours ($F_1$ to $F_{10}$) were created by randomly injecting single stuck at faults and performing faulty machine simulation. The number of initial candidate locations was selected using the signature based diagnosis approach set forth in method act-A.1.1 and method act-A.1.2. The exemplary MinSet and EQN-Trace procedures were then performed for these 9 failing behaviours. The number of inconsistent sets (k) in the EQN-Trace process was set at 32 (the actual number of failing bits in the observed failing behaviour). The results of these experiments are in Table 3:

TABLE 3

Initial Candidate Set Size Reduction Results

| | Number of Initial Candidates | | | |
|---|---|---|---|---|
| Failing Behaviour | Signature Based Diagnosis | MinSet (% Reduction) | | EQN-Trace (% Reduction) | |
| $F_1$ | 1819058 | 734806 | 60 | 1499150 | 18 |
| $F_2$ | 860396 | 278920 | 68 | 486403 | 43 |
| $F_3$ | 2147917 | 818801 | 62 | 1392363 | 35 |
| $F_4$ | 393274 | 180665 | 54 | 300402 | 24 |
| $F_5$ | 993065 | 385458 | 61 | 794188 | 20 |
| $F_6$ | 1933893 | 784864 | 59 | 1527405 | 21 |
| $F_7$ | 2155014 | 981434 | 54 | 1813337 | 16 |
| $F_8$ | 1800047 | 743496 | 59 | 1413877 | 21 |
| $F_9$ | 1914891 | 803599 | 58 | 1529621 | 20 |
| Average | 1557506 | 634671 | 59 | 1195194 | 24 |
| Average Time | 1 | 8.5X | | 1.16X | |

In the above table, the second columns next to the MinSet and EQN-Trace columns report the percentage reduction in the number of initial candidates using the two techniques respectively. As an example, for failing behaviour $F_1$, the initial candidate set size with the signature based diagnosis technique was 1,819,058 locations. The minimum possible initial candidate set size (MinSet column) was 734,806 locations, which is 60% smaller than the initial candidate set in signature based diagnosis. This represents the lower bound on the possible reduction in the size of the initial candidate set. The EQN-Trace procedure achieved an 18% reduction with the candidate set size being 1,499,150.

It can be seen from "Average" row in Table 3 that the average maximum reduction in initial candidate set size achievable over the signature based diagnosis technique was 59% and that the exemplary embodiment of the EQN-Trace procedure was able to achieve a significant 24% reduction in set size. The last row ("Average Time") gives the execution time required for determining this initial candidate set size for each of these techniques normalized to the time taken by the signature based diagnosis initial candidate set selection time. It can be seen that the exemplary embodiment of the MinSet procedure takes 8.5× more time than signature based diagnosis to determine the lower bound on the initial candidate set size. However, and more importantly, the time taken by EQN-Trace is only marginally larger (only 1.16×) than the time taken by signature based diagnosis.

These results highlight the value of the exemplary techniques presented herein. Specifically, the results indicate that a large reduction in initial candidates is possible by combining the information from logic back-cone tracing with compactor equations and failure information. Further, a significant portion of this possible reduction can be reaped using embodiments of the EQN-Trace procedure with only marginal overheads.

CONCLUSION

Embodiments of the signature based diagnosis methodology offer a very attractive diagnosis method for Logic BIST tests because of its easy flow and minimal requirements. However, for large designs, run times may be long because a large number of initial candidate locations may be selected for simulation. Among the features of the disclosed technology that can be used alone, or in combination with one another, to help address these long run times are: the use of information from logic back-cone tracing along with the compactor equations and failing behavior to filter out locations that can never explain the failing behavior; methods to determine the minimum initial candidate set size that use only the information from logic back-cone tracing and compactor equations (e.g., the exemplary MinSet embodiments); methods that use logic back cone tracing to efficiently exploit the above concepts and achieve a significant reduction in candidate set size (e.g., the exemplary EQN-trace embodiments); and the use of super variables that allow for a major performance improvement in all the operations involved in exemplary EQN-Trace and MinSet procedures. The experimental results presented show the effectiveness of embodiments of the disclosed techniques for a large industrial design. Embodiments of the disclosed techniques can be generally applied to any linear test response compactor and are not limited to MISR or Logic BIST.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of signature-based diagnosis, comprising:
receiving a signature generated by a test response compactor in a circuit, the signature having one or more failing bits;
generating pseudo failing bits based on the signature and compactor equations associated with the test response compactor;
determining initial candidate locations in the circuit based on the one or more failing bits and the pseudo failing bits; and
performing a simulation using the initial candidate locations to derive candidate defect locations in the circuit.

2. The method recited in claim 1, wherein the generating pseudo failing bits comprises:
determining inconsistent scan cells based on the signature and compactor equations associated with the test response compactor; and
deriving pseudo failing bits based on the inconsistent scan cells.

3. The method recited in claim 2, wherein the determining inconsistent scan cells comprises:
determining reduced compactor equations based on the signature and compactor equations associated with the test response compactor; and
deriving inconsistent scan cells based on the reduced compactor equations.

4. The method recited in claim 1, wherein the determining initial candidate locations comprises:
determining scan cells associated with the one or more failing bits and the pseudo failing bits using the compactor equations and
derive initial candidate locations by performing logic back-cone tracing operations based on the scan cells.

5. The method recited in claim 4, wherein the performing logic back-cone tracing operations comprises:
determining super variables based on the scan cells;
determining unions of logic back cones for each of subsets of the super variables, one of the subsets of the super variables corresponding to one of the failing bits; and
forming intersections of the unions to derive initial candidate locations.

6. The method recited in claim 4, wherein the performing logic back-cone tracing operations comprises:
determining unions of logic back cones for each of subsets of the scan cells, one of the subsets of the scan cells corresponding to one of the failing bits; and
forming intersections of the unions to derive initial candidate locations.

7. A method of signature-based diagnosis, comprising:
receiving a signature generated by a test response compactor in a circuit, the signature having one or more failing bits;
determining scan cells that are in one or more compactor equations for the one or more failing bits;
determining inconsistent scan cells based on the signature and compactor equations associated with the test response compactor;
determining initial candidate locations in the circuit based on the scan cells and the inconsistent scan cells; and
performing a simulation using the initial candidate locations to derive candidate defect locations in the circuit.

8. The method recited in claim 7, wherein the determining inconsistent scan cells comprises:
determining reduced compactor equations based on the signature and compactor equations associated with the test response compactor; and
deriving inconsistent scan cells based on the reduced compactor equations.

9. The method recited in claim 7, wherein the determining initial candidate locations comprises:
determining first candidate locations based on the scan cells;
determining second candidate locations in an exclusive logic back-cone of the inconsistent scan cells; and
deriving initial candidate locations by removing second candidate locations from the first candidate locations.

10. The method recited in claim 7, wherein the scan cells are super variables and the inconsistent scan cells are inconsistent super variables.

11. A processor-readable medium storing processor-executable instructions for causing one or more processors to perform a method of signature-based diagnosis, the method comprising:
receiving a signature generated by a test response compactor in a circuit, the signature having one or more failing bits;
generating pseudo failing bits based on the signature and compactor equations associated with the test response compactor;
determining initial candidate locations in the circuit based on the one or more failing bits and the pseudo failing bits; and
performing a simulation using the initial candidate locations to derive candidate defect locations in the circuit.

12. The processor-readable medium recited in claim 11, wherein the generating pseudo failing bits comprises:
determining inconsistent scan cells based on the signature and compactor equations associated with the test response compactor; and
deriving pseudo failing bits based on the inconsistent scan cells.

13. The processor-readable medium recited in claim 12, wherein the determining inconsistent scan cells comprises:
determining reduced compactor equations based on the signature and compactor equations associated with the test response compactor; and
deriving inconsistent scan cells based on the reduced compactor equations.

14. The processor-readable medium recited in claim 11, wherein the determining initial candidate locations comprises:
determining scan cells associated with the one or more failing bits and the pseudo failing bits using the compactor equations and
derive initial candidate locations by performing logic back-cone tracing operations based on the scan cells.

15. The processor-readable medium recited in claim 14, wherein the performing logic back-cone tracing operations comprises:
determining super variables based on the scan cells;
determining unions of logic back cones for each of subsets of the super variables, one of the subsets of the super variables corresponding to one of the failing bits; and forming intersections of the unions to derive initial candidate locations.

16. The processor-readable medium recited in claim 14, wherein the performing logic back-cone tracing operations comprises:
   determining unions of logic back cones for each of subsets of the scan cells, one of the subsets of the scan cells corresponding to one of the failing bits; and
   forming intersections of the unions to derive initial candidate locations.

17. A processor-readable medium storing processor-executable instructions for causing one or more processors to perform a method of signature-based diagnosis, the method comprising:
   receiving a signature generated by a test response compactor in a circuit, the signature having one or more failing bits;
   determining scan cells that are in one or more compactor equations for the one or more failing bits;
   determining inconsistent scan cells based on the signature and compactor equations associated with the test response compactor;
   determining initial candidate locations in the circuit based on the scan cells and the inconsistent scan cells; and
   performing a simulation using the initial candidate locations to derive candidate defect locations in the circuit.

18. The processor-readable medium recited in claim 17, wherein the determining inconsistent scan cells comprises:
   determining reduced compactor equations based on the signature and compactor equations associated with the test response compactor; and
   deriving inconsistent scan cells based on the reduced compactor equations.

19. The processor-readable medium recited in claim 17, wherein the determining initial candidate locations comprises:
   determining first candidate locations based on the scan cells;
   determining second candidate locations in an exclusive logic back-cone of the inconsistent scan cells; and
   deriving initial candidate locations by removing second candidate locations from the first candidate locations.

20. The processor-readable medium recited in claim 17, wherein the scan cells are super variables and the inconsistent scan cells are inconsistent super variables.

\* \* \* \* \*